(12) United States Patent
Melvin, III et al.

(10) Patent No.: US 7,509,624 B2
(45) Date of Patent: *Mar. 24, 2009

(54) METHOD AND APPARATUS FOR MODIFYING A LAYOUT TO IMPROVE MANUFACTURING ROBUSTNESS

(75) Inventors: Lawrence S. Melvin, III, Hillsboro, OR (US); Ebo K.G. Croffie, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 360 days.

This patent is subject to a terminal disclaimer.

(21) Appl. No.: 11/439,816

(22) Filed: May 24, 2006

(65) Prior Publication Data

US 2006/0212839 A1 Sep. 21, 2006

(51) Int. Cl.
*G06F 17/50* (2006.01)
(52) U.S. Cl. .............................. 716/21; 716/2; 716/19; 716/20

(58) Field of Classification Search ..................... 716/2, 716/5, 19–21; 430/5, 30
See application file for complete search history.

(56) References Cited

U.S. PATENT DOCUMENTS 7,001,693 B2 * 2/2006 Liebmann et al. .............. 430/5

* cited by examiner

*Primary Examiner*—Vuthe Siek
(74) *Attorney, Agent, or Firm*—Park, Vaughan & Fleming LLP (57) ABSTRACT

One embodiment of the present invention provides a system that modifies a layout to improve manufacturing robustness. During operation, the system receives a layout. The system then selects a segment in the layout. Next, the system determines a target location in the proximity of the segment where the value of a process-sensitivity model is within a desired range of values. The system then modifies the layout so that the segment is located at the target location. The layout modification can cause the pattern which is associated with the segment to exhibit isofocal behavior, which can improve manufacturing robustness.

16 Claims, 5 Drawing Sheets

METHOD AND APPARATUS FOR MODIFYING A LAYOUT TO IMPROVE MANUFACTURING ROBUSTNESS

RELATED APPLICATION

This application is related to U.S. Pat. No. 7,251,807, entitled, "METHOD AND APPARATUS FOR IDENTIFYING A MANUFACTURING PROBLEM AREA IN A LAYOUT USING A PROCESS-SENSITIVITY MODEL," by inventors Lawrence S. Melvin III and James P. Shiely filed on 24 Feb. 2005. This application is also related to U.S. patent application Ser. No. 11/109,534, entitled, "METHOD AND APPARATUS FOR DETERMINING AN IMPROVED ASSIST FEATURE CONFIGURATION IN A MASK LAYOUT," by inventors Lawrence S. Melvin III and Benjamin D. Painter filed on 19 Apr. 2005, which is hereby incorporated by reference herein to describe how a process-sensitivity model can be used to place assist features in a layout.

BACKGROUND

1. Field of the Invention

The present invention relates to semiconductor manufacturing. More specifically, the present invention relates to a method and apparatus for modifying a layout to improve manufacturing robustness.

2. Related Art

The dramatic improvements in semiconductor integration densities in recent years have largely been made possible by corresponding improvements in semiconductor manufacturing technologies.

One such semiconductor manufacturing technology involves placing assist features in a mask layout. Assist features (AFs) can be printing (e.g., super-resolution assist features) or non-printing (e.g., sub-resolution assist features). In either case, assist features are meant to improve the depth of focus of the patterns intended to be printed on the wafer, while maintaining pattern fidelity.

Prior art techniques for placing assist features typically use mask rules, which place and cleanup assist features based on combinations of feature width and spacing parameters. Such rule-based approaches can result in missed or sub-optimal placement and/or cleanup of assist features. Further, the complexity of such rules increases rapidly with shrinking features size, thereby requiring more wafer data for calibration and more effort on the part of engineers. Moreover, these rules can be overly restrictive which can prevent designers from being able to achieve the best semiconductor device performance.

Another technique for improving manufacturing robustness involves resizing a line (changing the width of the line). However, as was the case with assist features, prior art techniques resize lines based on rule tables, which can result in missed or sub-optimal resizing.

Hence, what is needed is a method and apparatus for modifying a layout to improve manufacturing robustness without the above-described problems.

SUMMARY

An isofocal pattern is a pattern that does not change (or changes very slightly) as focus changes. Since isofocal patterns are largely insensitive to focus drift, they can substantially improve manufacturing yield.

One embodiment of the present invention modifies the shape of a polygon in a layout which causes the polygon to exhibit isofocal behavior, which, in turn, improves manufacturing robustness.

Specifically, an embodiment uses a process-sensitivity model to modify a layout. The value of the process-sensitivity model at a location in the layout is associated with the through-process window at that location. In particular, a pattern exhibits isofocal behavior if the value of the process-sensitivity model on the edge of the pattern is within a desired range of values.

One embodiment modifies a layout by first selecting a segment in the layout. Next, the system determines a target location in the proximity of the segment where the value of the process-sensitivity model is within the desired range of values which is associated with isofocal behavior. The system then modifies the layout so that the segment is located at the target location. The layout modification can cause the pattern which is associated with the segment to exhibit isofocal behavior, which can improve manufacturing robustness.

DETAILED DESCRIPTION

Integrated Circuit Design Flow

Figure 1:
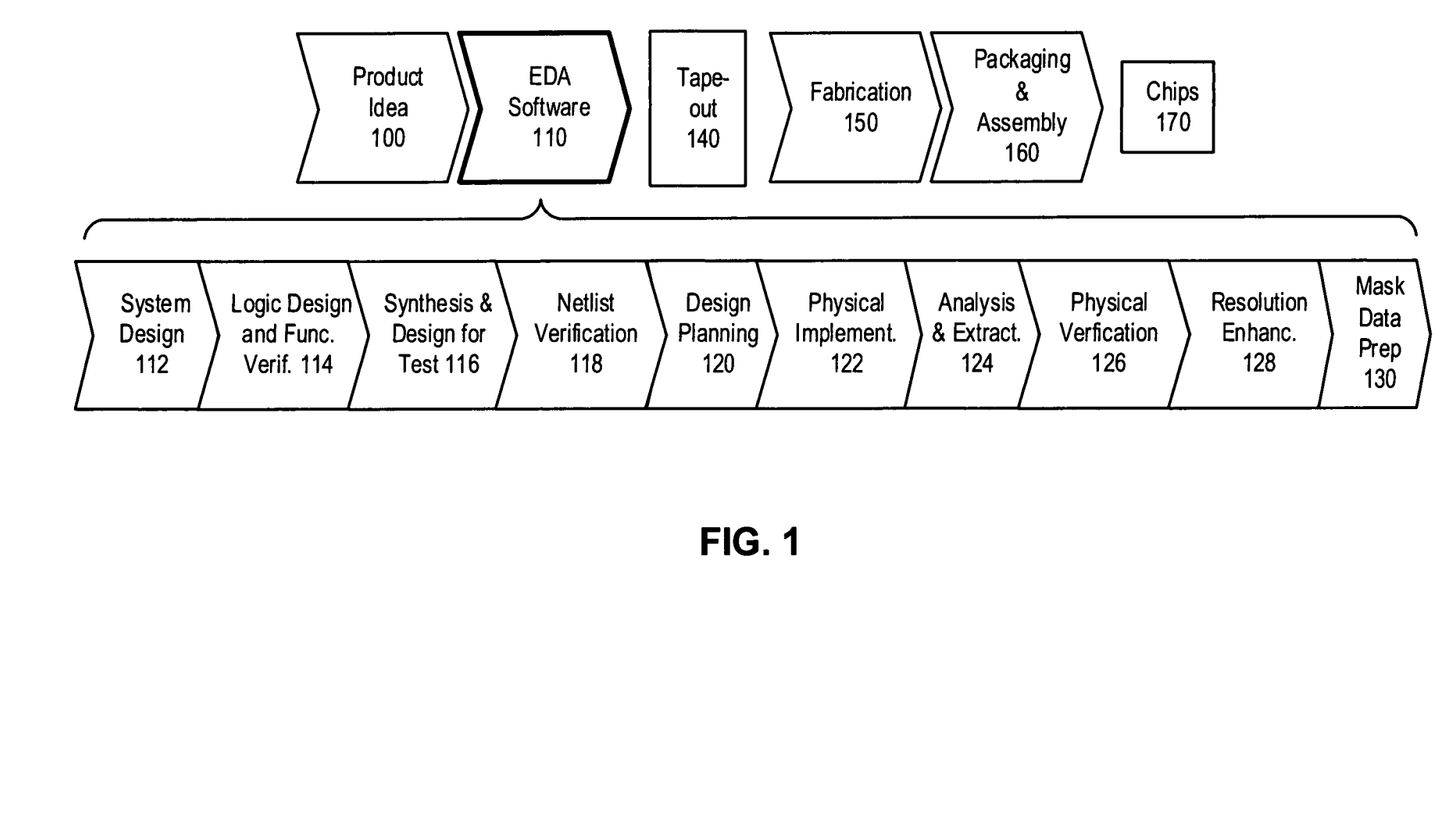
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above described steps. Specifically, one embodiment of the present invention can be used during the resolution enhancement step 128.

Process Variations

Semiconductor manufacturing technologies typically include a number of processes which involve complex physical and chemical interactions. These interactions can cause process variations that can cause the characteristics of the actual integrated circuit to be different from the desired characteristics. If this difference is too large, it can lead to manufacturing problems which can reduce the yield and/or reduce the performance of the integrated circuit.

Process variations can arise due to a variety of reasons. For example, in photolithography, variations in the rotation speed of the spindle can cause the resist thickness to vary, which can cause variations in the reflectivity, which, in turn, can cause unwanted changes to the pattern. Similarly, bake plates—which are used to drive the solvents out of the wafer and to form the pattern in the photoresist—can have hot or cold spots, which can cause variations in the critical dimension (CD).

It is helpful to classify process variations into two types: random and systematic. Random process variations are those process variations that are not presently being modeled using an analytical model. On the other hand, systematic process variations are those process variations that are typically modeled using analytical models. For example, spindle speed variation is typically classified as a random process variation, while pattern corner rounding has been compensated for in a systematic manner. Researchers are continually trying to convert random process variations into systematic process variations by creating new analytical models that model random process variations. Note that the term "depth of focus" is typically used as a catch all term to describe the amount of random and systematic process variations.

Manufacturing Problems

To be economically viable, a semiconductor manufacturing process has to be robust with respect to process variations, i.e., it must be able to tolerate a large enough range of process variations. Improving the manufacturing robustness (or depth of focus and exposure latitude) directly results in cost savings. This is because improving depth of focus and exposure latitude reduces the amount of time spent on inspection, servicing, and maintenance of the equipment, thereby increasing the number of wafers that are run. Furthermore, improving the depth of focus can increase the yield. Due to these reasons, increasing depth of focus can substantially increase profits.

Moreover, improving depth of focus becomes even more important as a manufacturing process shifts to smaller dimensions because the inherent depth of focus in these processes becomes rapidly smaller. Specifically, at deep submicron dimensions, even a small improvement in the depth of focus can save millions of dollars in manufacturing costs.

Process-Sensitivity Model

One of the goals of process modeling is to, in one measurement, get all the process variation information at a location in a mask layout. If this can be achieved, one can reduce process variation by appropriately modifying the layout, thereby improving the manufacturability of the layout. For example, if a designer knows that a line-end is highly sensitive to process variations and is likely to pull back 40 nm during manufacturing, he/she can use this information to add or adjust an assist feature to fix the manufacturing problem.

It is very important that one identifies these problem areas without using a substantial amount of computation (time or cycles). Theoretically, problem areas may be identified by simulating various process conditions separately and by comparing the resulting patterns to determine areas that can cause manufacturability problems. Unfortunately, this approach is not practical because it will most likely require an infeasible amount of computational resources for running multiple complex simulation models.

Hence, what is needed is a process-sensitivity model that can quickly tell us whether an assist feature is going to improve the stability of a structure within a workable process window.

Note that determining whether a structure is stable or not depends on the type of the layer. For example, in a metal layer, significant CD variations may be acceptable as long as they do not cause a short or an open in the circuit. On the other hand, significant line end shortening is usually not acceptable because of contact/via coverage. In contrast, in a polysilicon layer, even very small CD variations may be unacceptable, even though the line-end pullback margin from design rules may allow for some pullback tolerance.

In one embodiment, the system can determine the process-sensitivity model by first creating an on-target process model that models semiconductor manufacturing processes under nominal process conditions. Note that the semiconductor processing technology can include photolithography, etch, chemical-mechanical polishing (CMP), trench fill, and/or other technologies and combinations of the foregoing.

Next, the system can create one or more off-target process models that model the semiconductor manufacturing processes under one or more process conditions that are different from nominal process conditions.

A process model can be represented by a multidimensional function. Specifically, a process model can be represented using a set of basis functions. In one embodiment, creating an on-target process model involves fitting the process model to process data under nominal process conditions. Likewise, creating the one or more off-target process models can involve fitting the process model to process data for process conditions that are different from the nominal process conditions. Alternatively, the one or more off-target process models can be created by perturbing the on-target process model.

Figure 2A:
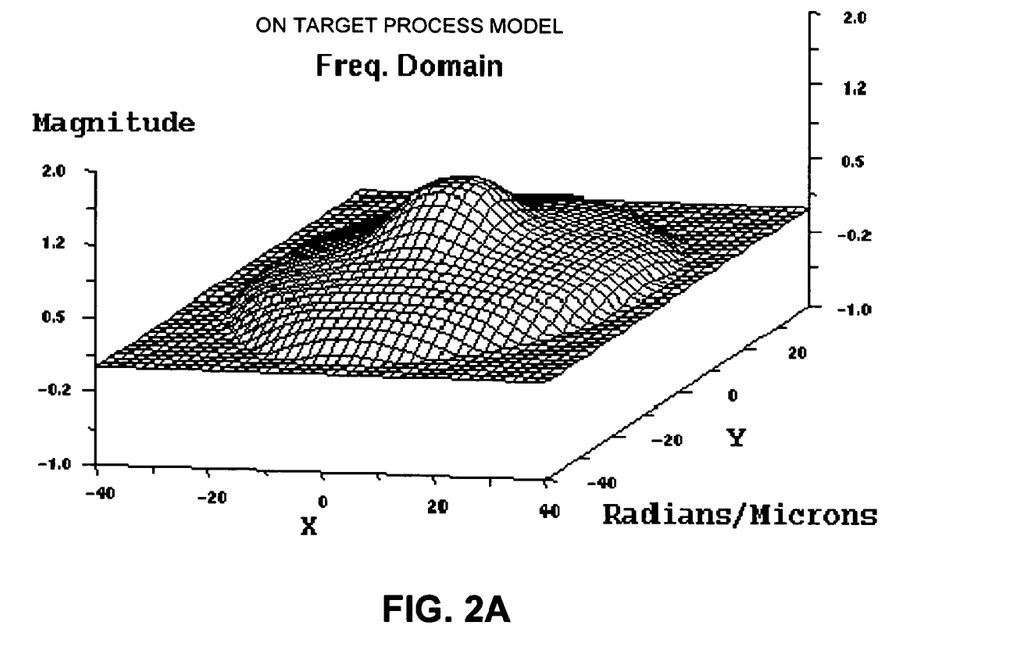
FIG. 2A illustrates a plot of a 2-D function that represents an on-target process model in accordance with an embodiment of the present invention.

FIG. 2A illustrates a plot of a 2-D function that represents an on-target process model in accordance with an embodiment of the present invention.

Figure 2B:
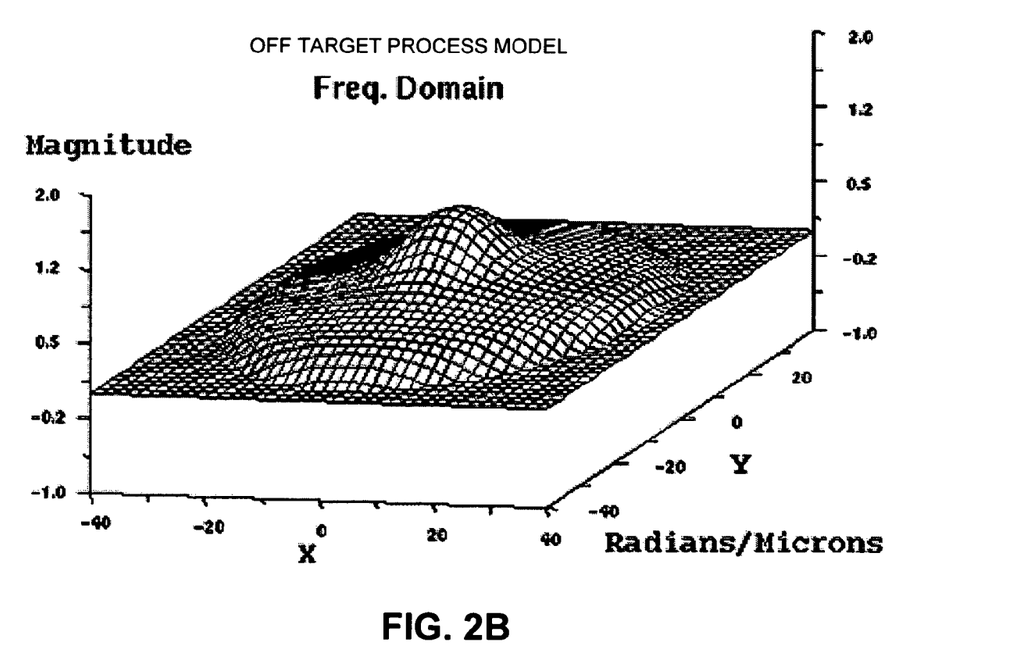
FIG. 2B illustrates a plot of a 2-D function that represents an off-target process model in accordance with an embodiment of the present invention.

FIG. 2B illustrates a plot of a 2-D function that represents an off-target process model in accordance with an embodiment of the present invention.

Figure 2C:
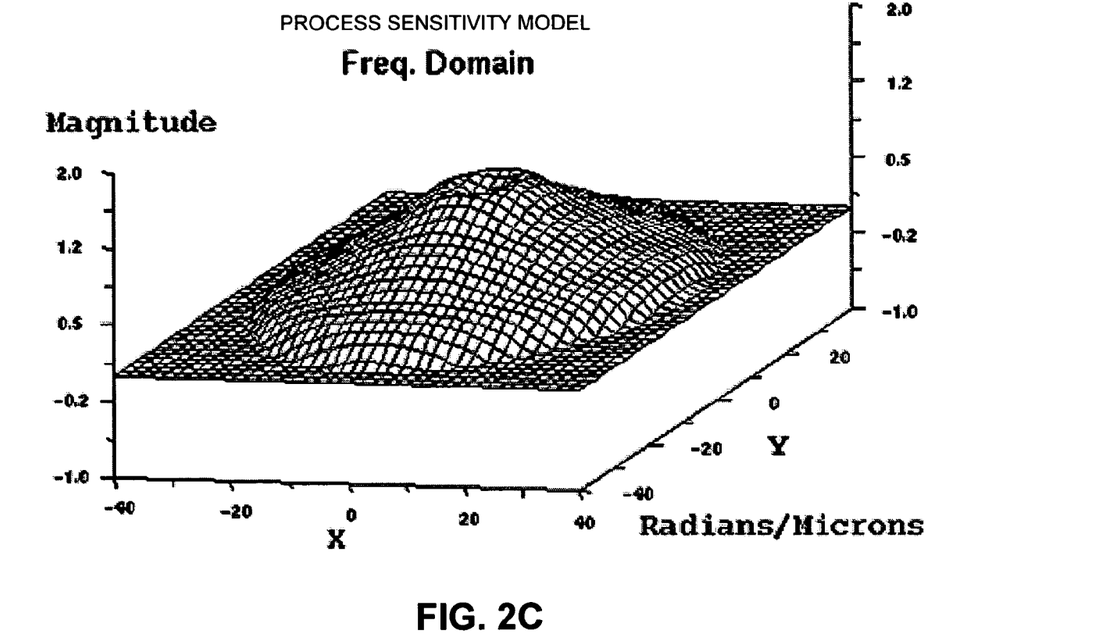
FIG. 2C illustrates a plot of a process-sensitivity model in accordance with an embodiment of the present invention.

FIG. 2C illustrates a plot of a process-sensitivity model in accordance with an embodiment of the present invention.

Note that the 2-D functions illustrated in FIG. 2A and FIG. 2B represent the on-target and the off-target process models, respectively, in the spatial frequency domain. In FIG. 2A, FIG. 2B, and FIG. 2C, the X and Y axes identify a spatial-frequency component (in units of radians per micron), whereas the Z axis indicates the magnitude of a specific spatial-frequency component. These process models can also be represented in other domains, such as the space domain. Additionally, these process models can also be represented in other coordinates, such as polar coordinates.

As an illustrative example, let us look at how we can create a process-sensitivity model for photolithography. Let $P_t$ represent an on-target process model, i.e., let $P_t$ model the optical lithography process when it is in focus, and let $P_d$ represent an off-target process model, e.g., let $P_d$ model the optical lithography process when it is defocused. Now, the process-sensitivity model, $F_p$ can be computed as follows: $F_p=(P_t-P_d)/\Delta P_d$, where $\Delta P_d$ is the focus offset (in units of length).

In the above example, we only considered a single off-target process model. But, we can have two or more off-target process models. In general, the process-sensitivity model, $F_p$, can be computed as follows:

$$F_p = \frac{1}{n}\left(\frac{1}{\Delta P_1}(P_t - P_1) + \frac{1}{\Delta P_2}(P_t - P_2) + \ldots + \frac{1}{\Delta P_n}(P_t - P_n)\right),$$

where, $P_{1\ldots n}$ are off-target process models that model arbitrary (e.g., non-optimal) process conditions, $P_t$ is the on-target process model that models a nominal (e.g., optimal) process condition, and $\Delta P_{1\ldots n}$ are the respective changes in the process conditions between the nominal process condition and the arbitrary (1 . . . n) process conditions.

For example, let $P_t$ model the optical lithography process when it is in focus. Furthermore, let $P_{dn}$ model the optical lithography process when it is negatively defocused, i.e., the distance between the lens and the wafer is less than the on-target distance. Additionally, let $P_{dp}$ model the optical lithography process when it is positively defocused, i.e., the distance between the lens and the wafer is greater than the on-target distance. Now, the process-sensitivity model, $F_p$, can be computed as follows:

$$F_p = \frac{1}{2}\left(\frac{(P_0 - P_{dn})}{\Delta P_{dn}} + \frac{(P_0 - P_{dp})}{\Delta P_{dp}}\right),$$

where $\Delta P_{dn}$ and $\Delta P_{dp}$ are the negative and positive focus offsets (in units of length).

Note that $(P_t-P_{dn})/\Delta P_{dn}$ and $(P_t-P_{dp})/\Delta P_{dp}$ model the pattern features that are lost during negative and positive defocusing, respectively. In the above example, we compute the process-sensitivity model, $F_p$, by adding $(P_t-P_{dn})/\Delta P_{dn}$ and $(P_t-P_{dp})/\Delta P_{dp}$, and by dividing by 2 to normalize the process-sensitivity model. (Note that the process-sensitivity model can also be used without normalization.)

Isofocal Patterns

An isofocal pattern is a pattern that does not change (or changes very slightly) as focus changes. In other words, an isofocal shape on a mask will form substantially the same pattern on the wafer under focus conditions as well as under defocus conditions. Since isofocal patterns are largely insensitive to focus drift, they can substantially improve manufacturing yield.

Unfortunately, layout patterns usually do not exhibit isofocal behavior. However, a number of techniques can be used to modify the layout to create patterns that exhibit isofocal behavior, thereby improving manufacturing robustness. One such technique involves placing assist features.

Assist Features

Sub-resolution assist features (SRAFs) are often used to improve through-process robustness (or depth of focus) of lithographic mask patterns by increasing the use of spatial frequency components that are largely insensitive to variations in focus conditions. Corresponding increases in process margin can increase wafer yield and help to stretch existing technology to smaller process nodes.

Prior art techniques for placing assist features typically use mask rules that dictate the assist feature dimensioning and placement based on combinations of feature width and spacing parameters.

Figure 3:
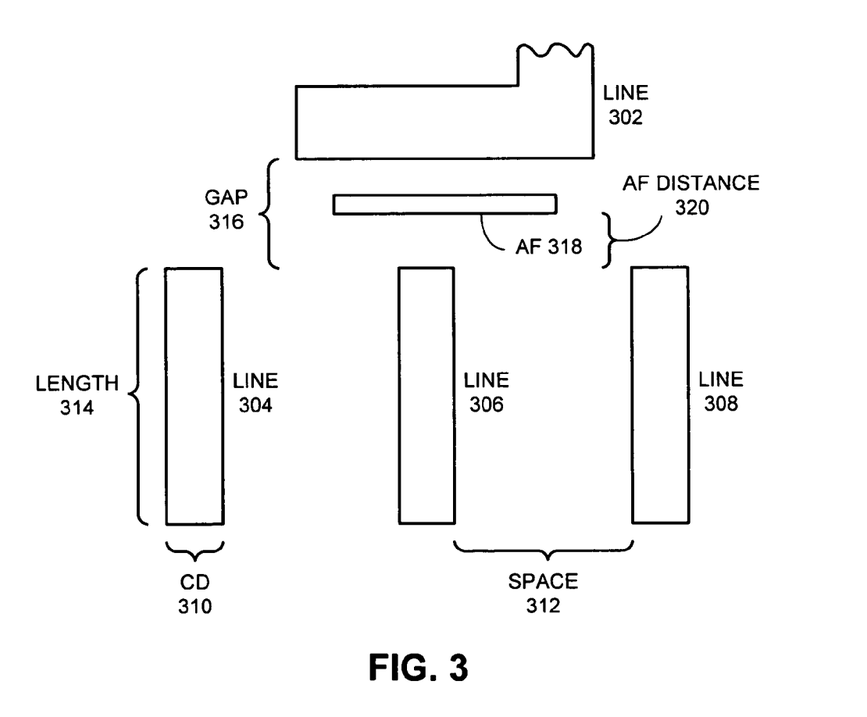
FIG. 3 illustrates assist feature placement using mask rules.

FIG. 3 illustrates assist feature placement using mask rules.

Lines 302, 304, 306, and 308 are part of a mask layout. In a rule-based approach, assist feature (AF) 318 placement/dimensioning can depend on a variety of factors which are organized in the form of a rule table. For example, the AF distance 320 can be a determined based on a rule table that includes a variety of factors, such as, the critical dimension (CD) 310, space 312, length 314, and gap 316.

Process of Modifying a Layout to Improve Manufacturing Robustness

Unfortunately, rule based approaches can result in missed or sub-optimal layout modifications, e.g., sub-optimal AF placements. Further, the complexity of such rules increases rapidly with shrinking features size, which requires more wafer data for calibration and more effort on the part of engineers. Moreover, these rules can be overly restrictive which can prevent designers from achieving the best semiconductor device performance.

For example, a rule table may specify that an assist feature should be placed between two lines when the lines are separated by 180 nm. If the layout contains two lines that are separated by 180 nm, placing an assist feature between the lines may substantially improve the manufacturing robustness. However, if the lines are slightly closer, e.g., 170 nm, the assist feature will not be placed, and hence, the potential benefits of adding an assist feature will be lost. Even if an assist feature is added according to a rule table, the manufacturing robustness may not improve substantially. This is because rule tables are usually created using empirical data that is obtained from a set of test layouts. Hence, if the rule table is applied to a layout that is different from those used for creating the rule table, there is no guarantee that modifying the layout according to the rule table will improve manufacturing robustness.

Another technique for improving the manufacturing robustness involves resizing a line (changing the width of the line). However, as was the case with assist features, prior art techniques resize a line based on rule tables, which can result in missed or sub-optimal resizing.

One embodiment of the present invention uses a model based approach (as opposed to a rule based approach) for modifying a layout to improve manufacturing robustness. Specifically, an embodiment of the present invention uses a process-sensitivity model to determine layout modifications which can substantially improve manufacturing robustness. Embodiments of the present invention do no suffer from the drawbacks of the prior art approaches.

Figure 4:
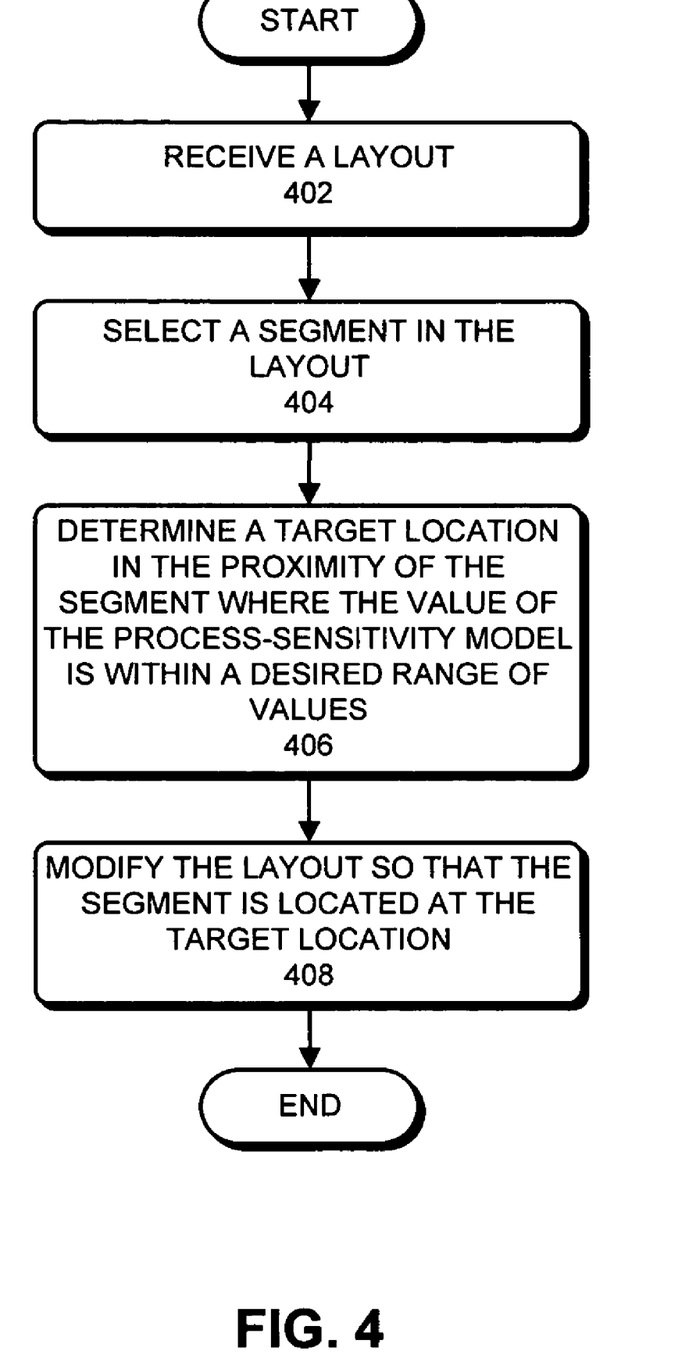
FIG. 4 presents a flowchart that illustrates a process for modifying a layout to improve manufacturing robustness in accordance with an embodiment of the present invention.

FIG. 4 presents a flowchart that illustrates a process for modifying a layout to improve manufacturing robustness in accordance with an embodiment of the present invention.

The process usually begins by receiving a layout (step 402).

Next, the system selects a segment in the layout (step 404). A segment can be a section of an edge of a polygon or it can be the entire edge of a polygon.

The system can select the segment by first dissecting the layout into a plurality of segments, and then selecting the segment from the plurality of segments. Alternatively, the system can directly select (or sample) a segment in the layout without performing a complete dissection.

Figure 5A:
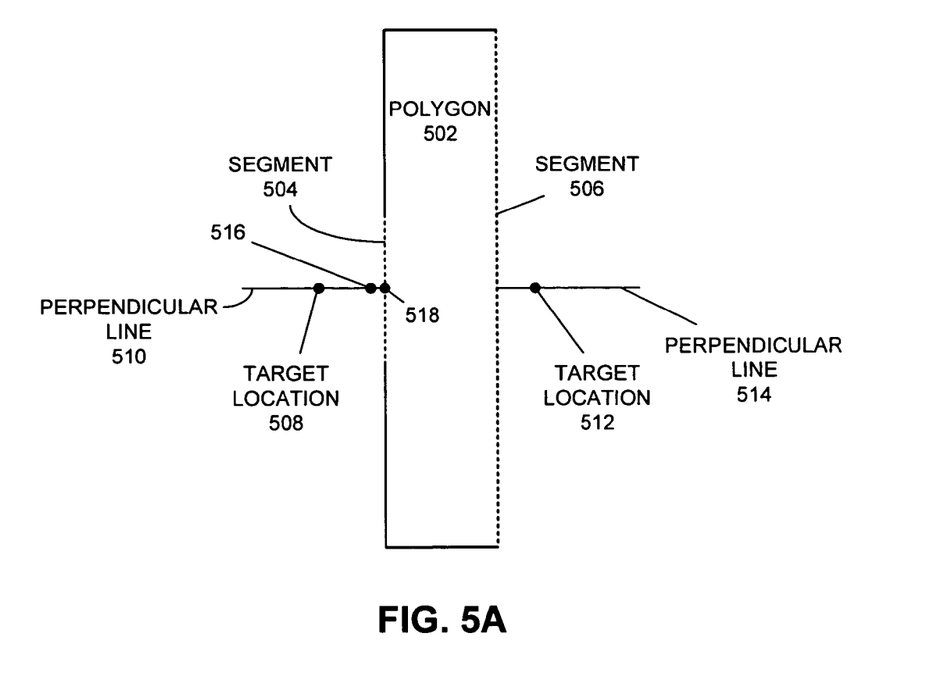
FIGS. 5A and 5B illustrate how a process-sensitivity model can be used to modify a layout to improve manufacturing robustness in accordance with an embodiment of the present invention.
Figure 5B:
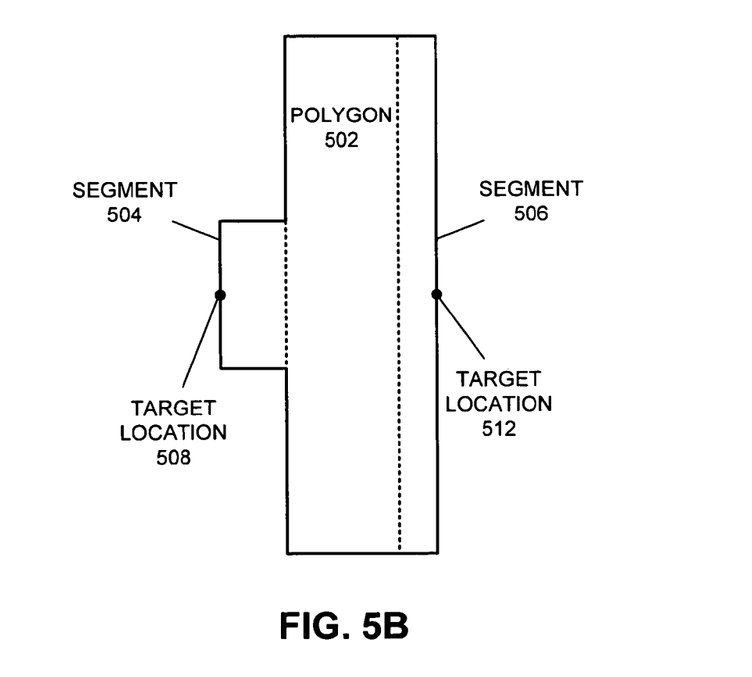

FIGS. 5A and 5B illustrate how a process-sensitivity model can be used to modify a layout to improve manufacturing robustness in accordance with an embodiment of the present invention.

Polygon 502 shown in FIG. 5A belongs to a layout. The system can select segments 504 and 506 (shown by dotted lines) in polygon 502. Note that segment 504 is a section of an edge of polygon 502, whereas segment 506 is an entire edge of polygon 502.

The system then determines a target location in the proximity of the segment where the value of the process-sensitivity model is within a desired range of values (step 406).

In one embodiment, the system determines the target location by first determining process-sensitivity values at a number of locations along a line which is perpendicular to the segment using the process-sensitivity model. Note that the system can determine the process-sensitivity value at a location by convolving the process-sensitivity model with a 2-D function which represents the layout. The system can then fit a curve through the process-sensitivity values, and determine the target location by determining a point on the curve where the curve's value falls within a desired range of values. Note that the desired range of values can be determined using the value of the process-sensitivity model at a point on a pattern that exhibits isofocal behavior.

The system can determine the target location by first constructing an analytical expression using the process-sensitivity values, and then determining a root for the analytical expression. Note that the system can use a number of techniques for determining the root of an analytical expression. For example, the system can use Newton-Raphson's technique for determining the root of the analytical expression.

In another embodiment, the system can directly find the target location by using a root searching technique to determine the roots using the process-sensitivity model. For example, the system can create an analytical expression using the process-sensitivity model, and then determine the roots of this analytical expression using a root searching technique (e.g., Newton-Raphson).

For example, for segment 504, the system can determine target location 508 along perpendicular line 510. Specifically, the system can first determine the value of the process-sensitivity model at locations 516 and 518 along the perpendicular line 510, and then determine the target location 508 using the process-sensitivity values at locations 516 and 518. Similarly, for segment 506, the system can determine target location 512 along perpendicular line 514.

Next, the system modifies the layout so that the segment is located at the target location (step 408).

For example, as shown in FIG. 5B, the system can modify the layout by shifting segments 504 and 506 to the target locations 508 and 512, respectively. (The modified shape of polygon 502 is depicted using solid lines.) Since the target locations represent the points where the value of the process-sensitivity model is equal to zero (or equal to the value of the process-sensitivity model on the edge of an isofocal polygon), modified polygon 502 is expected to exhibit isofocal behavior.

Note that a segment can be an entire edge of a polygon or only a section of an edge of a polygon. Allowing a segment to be only a section of a polygon is advantageous because different locations on an edge of a polygon may require different biases (or shifts) due to the differences in their neighboring geometries. Prior art techniques usually do not properly handle situations which require different biases for different segments. Prior art techniques usually require highly complex rule tables to handle such situations. Further, prior art techniques may cause adjacent segments to have very different biases which can cause manufacturing problems (e.g., pinching). In contrast, embodiments of the present invention can easily handle situations in which different biases need to be applied to different sections of a polygon's edge. This is because embodiments of the present invention use a process-sensitivity model instead of complex rule tables to determine the biases. Furthermore, using a process-sensitivity model gives the present invention more flexibility in determining how to assign biases to the various segments.

In one embodiment, the system performs layout modifications over multiple iterations until the modifications converge. For example, in the first iteration, the system can use the initial layout to determine the target locations and modify the layout by shifting each segment to its target location. The system can then use the modified layout to determine the next set of target locations and shift the segments to the new target locations. The system can continue this process for a predetermined number of iterations or until the modifications or shifts become insignificant. Furthermore, note that the system can determine modifications to a number of polygons in an iteration, and then use those modified polygons to determine a subsequent set of modifications in the next iteration.

Note that the present invention modifies the size and/or shape of the patterns that will appear on the wafer. The output of the present invention (i.e., the modified layout) can be used as the input for other RETs. For example, the modified layout that is generated by the present invention can be further modified using RETs, such as, optical proximity correction (OPC), assist features, dual dipole, and phase shift masks.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, although the invention has been described in the context of "one dimensional" shapes (e.g., polygon 502), the invention can be readily applied to more complex geometries (e.g., "two dimensional" geometries).

The above disclosure is not intended to limit the present invention. The scope of the present invention is defined by the appended claims.

What is claimed is:

1. A method for modifying a layout to improve manufacturing robustness, the method comprising:
   receiving a layout;
   selecting a segment in the layout;
   determining values of a process-sensitivity model at multiple locations in the layout by convolving the process-sensitivity model with a 2-D function which represents the layout;
   using the values to determine a target location in proximity to the segment where the process-sensitivity model's value is within a desired range of values; and
   modifying the layout so that the segment is located at the target location.

2. The method of claim 1, wherein the process-sensitivity model's value at a location in the layout is associated with a through-process window at that location.

3. The method of claim 1, wherein the process-sensitivity model is determined by:
   receiving an on-target process model that models semiconductor manufacturing processes under a first set of process conditions;
   receiving an off-target process model that models semiconductor manufacturing processes under a second set of process conditions, which are different from the first set of process conditions; and
   determining the process-sensitivity model using the on-target process model and the off-target process model.

4. The method of claim 1, wherein the multiple locations are located along a line which is perpendicular to the segment.

5. The method of claim 1, wherein selecting the segment involves:
   dissecting the layout into a plurality of segments; and
   selecting the segment from the plurality of segments.

6. The method of claim 1, wherein the desired range of values is determined using the process-sensitivity model's value on an edge of an isofocal pattern.

7. A computer-readable storage medium storing instructions that when executed by a computer cause the computer to perform a method for modifying a layout to improve manufacturing robustness, the method comprising:
   receiving a layout;
   selecting a segment in the layout;
   determining values of a process-sensitivity model at multiple locations in the layout by convolving the process-sensitivity model with a 2-D function which represents the layout;
   using the values to determine a target location in proximity to the segment where the process-sensitivity model's value is within a desired range of values; and
   modifying the layout so that the segment is located at the target location.

8. The computer-readable storage medium of claim 7, wherein the process-sensitivity model's value at a location in the layout is associated with a through-process window at that location.

9. The computer-readable storage medium of claim 7, wherein the process-sensitivity model is determined by:
   receiving an on-target process model that models semiconductor manufacturing processes under a first set of process conditions;
   receiving an off-target process model that models semiconductor manufacturing processes under a second set of process conditions, which are different from the first set of process conditions; and
   determining the process-sensitivity model using the on-target process model and the off-target process model.

10. The computer-readable storage medium of claim 7, wherein the multiple locations are located along a line which is perpendicular to the segment.

11. The computer-readable storage medium of claim 7, wherein selecting the segment involves:
    dissecting the layout into a plurality of segments; and
    selecting the segment from the plurality of segments.

12. The computer-readable storage medium of claim 7, wherein the desired range of values is determined using the process-sensitivity model's value on an edge of an isofocal pattern.

13. A method for modifying a polygon's shape in a layout for improving manufacturing robustness, the method comprising:
    receiving a layout;
    selecting a segment in the layout which is a section of an edge of a polygon;
    determining values of a process-sensitivity model at multiple locations in the layout by convolving the process-sensitivity model with a 2-D function which represents the layout, wherein the multiple locations are located along a line which is perpendicular to the segment;
    using the values to determine a first location where the process-sensitivity model's value is substantially equal to zero; and modifying the polygon's shape by shifting the segment to the first location, which causes the polygon to exhibit isofocal behavior, which, in turn, improves manufacturing robustness.

14. The method of claim 13, wherein the process-sensitivity model is determined by:
   receiving an on-target process model that models semiconductor manufacturing processes under a first set of process conditions;
   receiving an off-target process model that models semiconductor manufacturing processes under a second set of process conditions, which are different from the first set of process conditions; and
   determining the process-sensitivity model using the on-target process model and the off-target process model.

15. A computer-readable storage medium storing instructions that when executed by a computer cause the computer to perform a method for modifying a polygon's shape in a layout for improving manufacturing robustness, the method comprising:
   receiving a layout;
   selecting a segment in the layout which is a section of an edge of a polygon;
   determining values of a process-sensitivity model at multiple locations in the layout by convolving the process-sensitivity model with a 2-D function which represents the layout, wherein the multiple locations are located along a line which is perpendicular to the segment;
   using the values to determine a first location where the process-sensitivity model's value is substantially equal to zero; and
   modifying the polygon's shape by shifting the segment to the first location, which causes the polygon to exhibit isofocal behavior, which, in turn, improves manufacturing robustness.

16. The computer-readable storage medium of claim 15, wherein the process-sensitivity model is determined by:
   receiving an on-target process model that models semiconductor manufacturing processes under a first set of process conditions;
   receiving an off-target process model that models semiconductor manufacturing processes under a second set of process conditions, which are different from the first set of process conditions; and
   determining the process-sensitivity model using the on-target process model and the off-target process model.

* * * * *